(12) United States Patent
Jiang

(10) Patent No.: US 9,478,439 B2
(45) Date of Patent: Oct. 25, 2016

(54) SUBSTRATE ETCHING METHOD

(71) Applicant: BEIJING NMC CO., LTD., Beijing (CN)

(72) Inventor: Zhongwei Jiang, Beijing (CN)

(73) Assignee: BEIJING NMC CO., LTD., Beijing (CN)

(*) Notice: Subject to any disclaimer, the term of this patent is extended or adjusted under 35 U.S.C. 154(b) by 0 days.

(21) Appl. No.: 14/646,909

(22) PCT Filed: Nov. 1, 2013

(86) PCT No.: PCT/CN2013/086420
§ 371 (c)(1),
(2) Date: May 22, 2015

(87) PCT Pub. No.: WO2014/079315
PCT Pub. Date: May 30, 2014

(65) Prior Publication Data
US 2015/0311091 A1    Oct. 29, 2015

(30) Foreign Application Priority Data

Nov. 23, 2012  (CN) .......................... 2012 1 0482401

(51) Int. Cl.
*H01L 21/302* (2006.01)
*H01L 21/3213* (2006.01)
*H01L 21/3065* (2006.01)
*B81C 1/00* (2006.01)

(52) U.S. Cl.
CPC ..... *H01L 21/32137* (2013.01); *B81C 1/00531* (2013.01); *H01L 21/30655* (2013.01); *B81C 2201/0112* (2013.01); *B81C 2201/0132* (2013.01)

(58) Field of Classification Search
CPC .................. H01J 37/32091; H01L 21/32137; H01L 21/3213; H01L 21/30655; B81C 1/11

USPC .............................. 438/696, 689; 216/37, 67
See application file for complete search history.

(56) References Cited

U.S. PATENT DOCUMENTS 6,008,139 A * 12/1999 Pan .................... H01J 37/32091
257/E21.312
6,299,788 B1 10/2001 Wu et al.
2011/0117288 A1* 5/2011 Honda .................. C23C 16/045
427/533

FOREIGN PATENT DOCUMENTS

| CN | 101477096 A | 7/2009 |
| CN | 101962773 A | 2/2011 |
| CN | 102515089 A | 6/2012 |
| WO | 2011001778 A1 | 1/2011 |

OTHER PUBLICATIONS

PCT/CN2013/086420 International Search Report dated Jan. 30, 2014; 4pgs.

* cited by examiner

*Primary Examiner* — Duy Deo
*Assistant Examiner* — Maki Angadi
(74) *Attorney, Agent, or Firm* — Bracewell LLP; Brad Y. Chin

(57) ABSTRACT

Embodiments of the invention provide a substrate etching method, which includes: a deposition operation for depositing a polymer on a side wall of a silicon groove, an etching operation for etching the side wall of the silicon groove, and repeating the deposition operation and the etching operation at least twice. In the process of completing all cycles of the etching operation, a chamber pressure of a reaction chamber is decreased from a preset highest pressure to a preset lowest pressure according to a preset rule. The substrate etching method, according to various embodiments of the invention, avoid the problem of damaging the side wall, thereby making the side wall smooth.

15 Claims, 4 Drawing Sheets

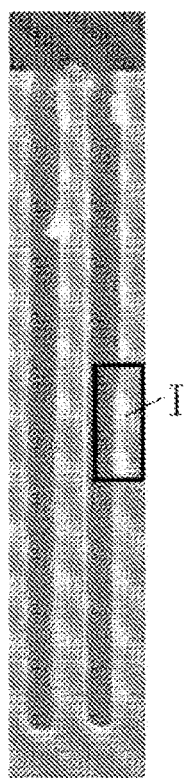
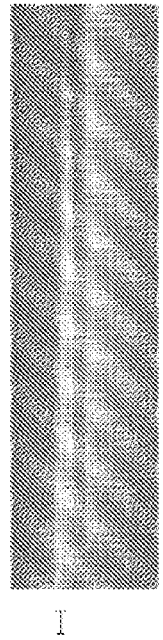
FIG. 3a      FIG. 3b
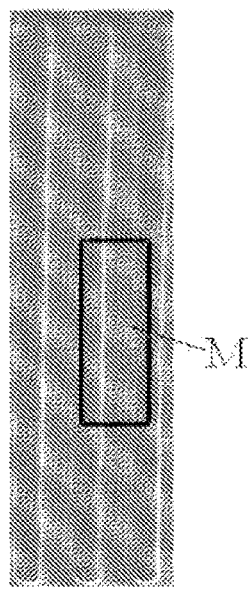
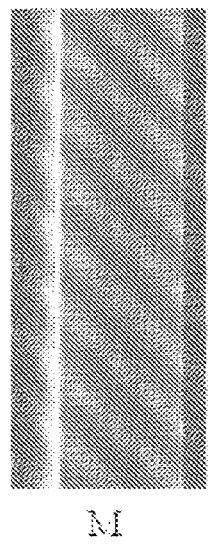
FIG. 3c      FIG. 3d

SUBSTRATE ETCHING METHOD

CROSS REFERENCE TO RELATED APPLICATION

This application claims the benefit of and priority to PCT/CN2013/086420 filed on Nov. 1, 2013, entitled (translation), "SUBSTRATE ETCHING METHOD," which claims the benefit of and priority to Chinese Patent Application No. 201210482401.6 filed on Nov. 23, 2012, entitled (translation), "SUBSTRATE ETCHING METHOD," both of which are hereby incorporated by reference in their entirety into this application.

BACKGROUND

1. Field of the Invention

Embodiments of the invention relate to the field of microelectronic technology, and particularly relate to a substrate etching method.

2. Description of the Related Art

With MEMS (Micro-Electro-Mechanical Systems) devices and MEMS systems being widely used in the fields of automobile and consumer electronics, and the broad prospect of TSV (Through-Silicon Via) etching techniques being used in the future packaging field, a Dry Plasma Deep Silicon Etching Process gradually becomes one of the hottest processes in the MEMS processing field and TSV technique.

The major difference between the deep silicon etching process and common silicon etching processes lies in that the etching depth of the deep silicon etching process is significantly larger than that of a common silicon etching process. Generally, the etching depth of the deep silicon etching process is tens of micrometers, or may be up to a hundred micrometers, while the etching depth of a common silicon etching process is less than 1 micrometer. To etch a silicon material with a thickness of tens of micrometers, the deep etching process is required to have a faster etching rate, a higher selectivity ratio and a larger aspect ratio.

At present, a mainstream deep silicon etching process is the Bosch process invented by Robert Bosch GMBH, Germany, or its optimizations, which have the main feature that the whole etching process is a process in which a single cyclic unit including an etching operation and a deposition operation is repeated multiple times, i.e., the whole etching process is cycles of the etching operation and the deposition operation. In this case, the process gas adapted for the etching operation is SF6. Further, in the process of performing the etching operation, in order that more active radicals can be generated to improve the etching rate of the process gas on a silicon substrate, the chamber pressure generally needs to be kept at a relatively high level throughout the process of performing the etching operation. However, this will lead to such a problem that the generated reaction products after etching can hardly be discharged from a silicon groove, so that the reaction products accumulated within the silicon groove damage a side wall of the silicon groove, the side wall of the silicon groove thus has a rough profile, which in turn causes the result of the etching process not ideal.

SUMMARY

Embodiments of the invention solve at least one of the technical problems existing in the prior art. Embodiments of the invention provide a substrate etching method, which avoids the problem of damaging a side wall of a silicon groove, thereby making the profile of the side wall of the silicon groove smooth.

According to at least one embodiment, there is provided a substrate etching method, which includes a deposition operation for depositing a polymer on a side wall of a silicon groove and an etching g operation for etching the side wall of the silicon groove, the deposition operation and the etching operation being alternately repeated at least twice.

According to at least one embodiment, in the process of completing all cycles of the etching operation, a chamber pressure of a reaction chamber is decreased from a preset highest pressure to a preset lowest pressure according to a preset rule.

According to at least one embodiment, the preset rule includes keeping, within a predetermined time elapsed from a start of a first etching operation, the chamber pressure at the preset highest pressure when performing the etching operation and decreasing, after the predetermined time elapsed from the start of the first etching operation, the chamber pressure from the preset highest pressure to the preset lowest pressure in accordance with a functional relationship in the process of subsequent etching operations.

According to at least one embodiment, after the predetermined time elapsed from the start of the first etching operation, the chamber pressure is kept unchanged in the process of each etching operation and the chamber pressure corresponding to each etching operation is lower than the chamber pressure corresponding to the previous etching operation. After the predetermined time elapsed from the start of the first etching operation, the chamber pressure is gradually decreased in accordance with a functional relationship in the process of each etching operation; and the chamber pressure corresponding to each etching operation is lower than the chamber pressure corresponding to the previous etching operation.

According to at least one embodiment, the predetermined time is in the range of 0.5 s to 20 s. For example, the predetermined time may be in the range of 1 s to 10 s.

According to at least one embodiment, the preset rule includes gradually decreasing the chamber pressure in accordance with a preset functional relationship in the process of completing all cycles of the etching operation.

According to at least one embodiment, the functional relationship includes one of a linear functional relationship, a piecewise functional relationship, an exponential functional relationship or a polynomial functional relationship.

According to at least one embodiment, the preset highest pressure is in the range of 20 mT to 200 mT, the preset lowest pressure is in the range of 1 mT to 40 mT, an excitation power is in the range of 50 W to 3000 W, a bias power is in the range of 0 W to 100 W, and flow of an etching gas is in the range of 50 sccm to 1000 sccm.

According to at least one embodiment, time for completing all cycles of the etching operation is 0.1 s to 100 s.

Embodiments of the invention provide non-obvious advantages of the conventional art:

According to the substrate etching method provided by various embodiments of the invention, in the process of completing all cycles of the etching operation, the chamber pressure is decreased from a preset highest pressure to a preset lowest pressure according to a preset rule, such that the generated reaction products after etching can be discharged from the silicon groove due to the decrease in the chamber pressure, so that the problem of damaging the side wall of the silicon groove can be avoided, thereby making the profile of the side wall of the silicon groove smooth and improving the process quality.

Various objects, advantages and features of the invention will become apparent from the following description of embodiments with reference to the accompanying drawings.

BRIEF DESCRIPTION OF THE DRAWINGS

These and other features, aspects, and advantages of the invention are better understood with regard to the following Detailed Description, appended Claims, and accompanying Figures. It is to be noted, however, that the Figures illustrate only various embodiments of the invention and are therefore not to be considered limiting of the invention's scope as it may include other effective embodiments as well.

FIG. 3a is a scanning electron micrograph of a profile of a side wall of a silicon groove obtained by adapting an existing substrate etching method according to an embodiment of the invention.

FIG. 3b is an enlarged view of Region I in FIG. 3a according to an embodiment of the invention.

FIG. 3c is a scanning electron micrograph of a profile of a side wall of a silicon groove obtained by adapting an substrate etching method according to an embodiment of the invention.

FIG. 3d is an enlarged view of Region M in FIG. 3c according to an embodiment of the invention.

DETAILED DESCRIPTION

Figure 1:
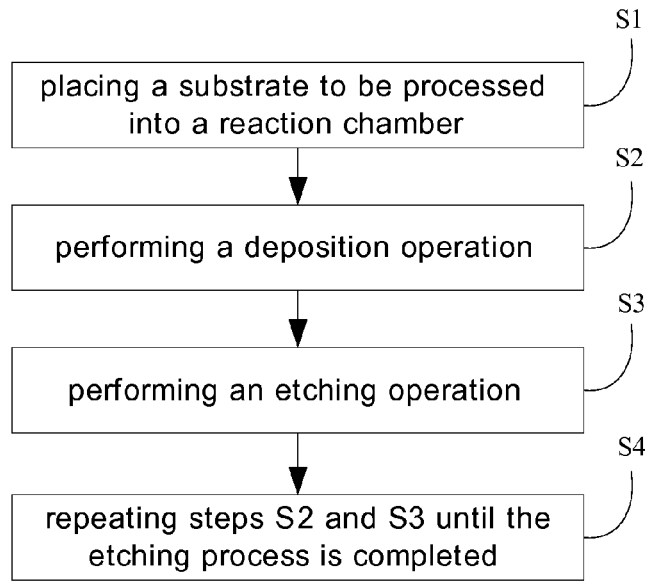
FIG. 1 is a flowchart of a substrate etching method according to an embodiment of the invention.

Advantages and features of the invention and methods of accomplishing the same will be apparent by referring to embodiments described below in detail in connection with the accompanying drawings. However, the invention is not limited to the embodiments disclosed below and may be implemented in various different forms. The embodiments are provided only for completing the disclosure of the invention and for fully representing the scope of the invention to those skilled in the art.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. According to at least one embodiment, the dimensions of some of the elements in the figures may be exaggerated relative to other elements to help improve understanding of embodiments of the invention. Like reference numerals refer to like elements throughout the specification.

According to various embodiments of the invention, a deposition operation is used for depositing a polymer on a side wall of a silicon groove; an etching operation is used for etching the side wall of the silicon groove; and, in the whole etching process, the deposition operation and the etching operation are alternately repeated at least twice, i.e., an integral deposition etching operation process refers to a process in which the deposition operation and the etching operation are each performed once, and the deposition-etching operation process is performed at least twice in the whole etching process. In practical applications, within one integral deposition-etching operation process, the etching operation is performed after the deposition operation; or the deposition operation is performed after the etching operation. The order in which the two operations are performed is set based on specific cases.

Thereinafter, a substrate etching method according to an embodiment of the invention will be described in detail with reference to FIG. 1.

Referring to FIG. 1, a flowchart of the substrate etching method according to the embodiment of the invention is illustrated. Specifically, the method includes the following steps of S1 to S4.

At step S1, a substrate to be processed, such as a silicon wafer, is placed into a reaction chamber.

At step S2, a deposition operation is performed. The deposition operation specifically includes at least the following steps of: introducing a depositing gas into the reaction chamber; turning on an excitation power supply (e.g., a RF power supply) to generate plasmas inside the reaction chamber; and turning on a bias power supply to supply a bias power to the substrate to be processed. According to at least one embodiment, the depositing gas is one of $C_4F_4$ or $C_2F_4$.

At step S3, an etching operation is performed. The etching operation specifically includes at least the following steps of: stopping introducing the depositing gas into the reaction chamber, and introducing an etching gas into the reaction chamber at the same time; turning on an excitation power supply (e.g., a RF power supply) to generate plasmas inside the reaction chamber; and turning on a bias power supply to supply a bias power to the substrate to be processed. According to at least one embodiment, the etching gas is SF6.

At step S4, the above steps S2 and S3 are repeated until the etching on the substrate is completed.

It should be noted that, in the process of completing all cycles of the etching operation as described in S3, the pressure of the reaction chamber (hereinafter simply referred to as the chamber pressure) corresponding to the etching operation is gradually decreased from a preset highest pressure to a preset lowest pressure according to a preset rule. According to at least one embodiment, the so-called "process of completing all cycles of the etching operation as described in S3" refers to the process of all of the etching operations in the whole etching process, and the so-called "the process of all of the etching operations" can be understood in such a way that all of the etching operations are extracted from the whole etching process and the respective etching operations are arranged in time order so that the process of all of the etching operations is formed.

Next, six preset rules used for lowering the chamber pressure will be described in details in conjunction with the sequence diagrams shown in FIGS. 2a to 2f. In each of the diagrams, the chamber pressure is represented by an ordinate which is indicated by P; and an abscissa represents two parameters, one of which is the cyclic order of each etching operation, i.e., the current etching operation as described in the above step S3 is in which cycle, and is indicated by N; the other one is accumulated etching time, and is indicated by t. The so-called accumulated etching time is the time for completing all cycles of the etching operation.

Figure 2A:
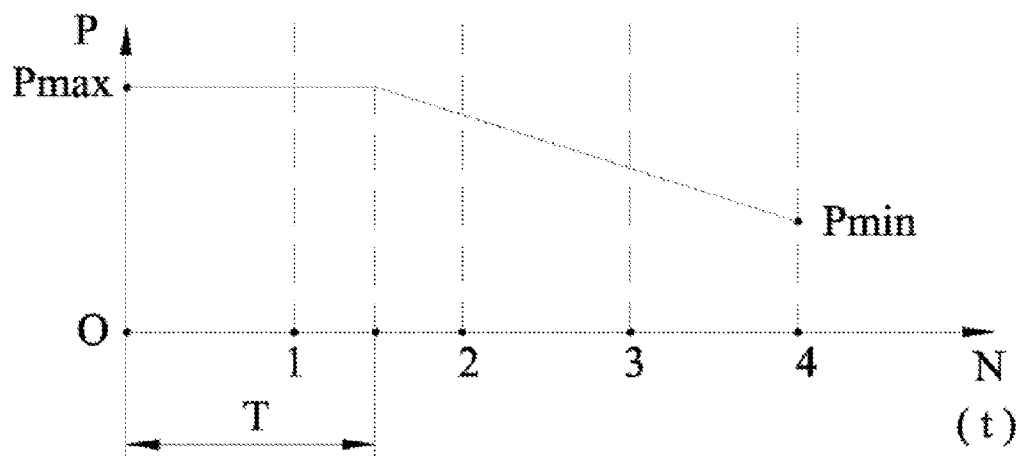
FIG. 2a is a sequence diagram of a first preset rule used for lowering a chamber pressure employed in a substrate etching method according to an embodiment of the invention.

Referring to FIG. 2a, a sequence diagram of a first preset rule used for lowering the chamber pressure employed in a substrate etching method according to an embodiment of the invention is illustrated.

As shown in FIG. 2a, within a predetermined time T elapsed from the start of the first etching operation, the chamber pressure corresponding to the each etching operation is kept at a preset highest pressure $P_{max}$ at all times. Further, in the process of all of the subsequent etching operations after the predetermined time T, the chamber pressure is decreased from the present highest pressure $P_{max}$ to a present lowest pressure $P_{min}$ in accordance with a linear functional relationship, i.e., the chamber pressure P is a linear functional relationship with the accumulated etching time t and the cyclic order N of each etching operation, and the chamber pressure is gradually decreased from $P_{max}$ to $P_{min}$ with the increase in the accumulated etching time t and the cyclic order N of each etching operation.

Specifically, in the process of all of the subsequent etching Operations after the predetermined time T, for each etching operation, the chamber pressure varies with the accumulated etching time (or the etching time of the current etching operation) in a linear functional relationship; and further, for the process of all of the subsequent etching operations after the predetermined time T, the chamber pressure corresponding to each etching operation is gradually decreased in a linear functional relationship compared to the chamber pressure corresponding to the previous etching operation. In the embodiment, the accumulated etching time includes the so-called predetermined time T.

Figure 2B:
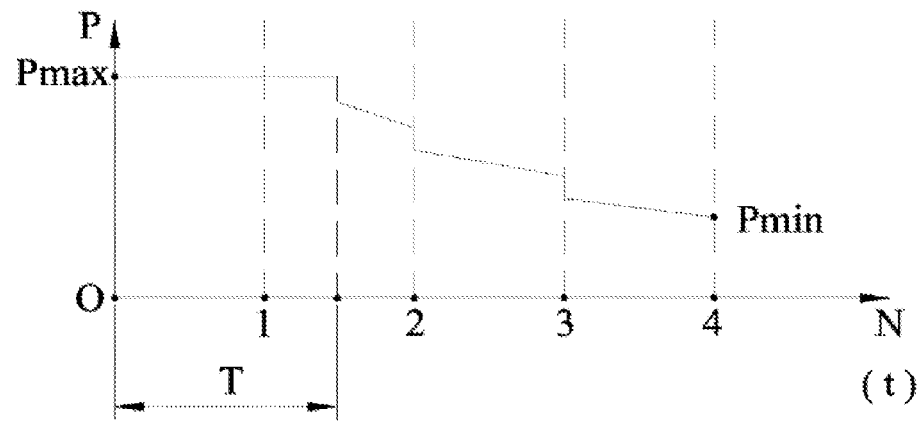
FIG. 2b is a sequence diagram of a second preset rule used for lowering a chamber pressure employed in a substrate etching method according to an embodiment of the invention.

Referring to FIG. 2b, a sequence diagram of a second preset rule used for lowering the chamber pressure employed in a substrate etching method according to an embodiment of the invention is illustrated.

As shown in FIG. 2b, within a predetermined time T elapsed from the start of the first etching operation, the chamber pressure corresponding to each etching operation is kept at a preset highest pressure $P_{max}$ at all times. Further, in the process of all of the subsequent etching operations after the predetermined time T, the chamber pressure is decreased from the preset highest pressure $P_{max}$ to a preset lowest pressure $P_{min}$ in accordance with a piecewise functional relationship, i.e., the chamber pressure P is in piecewise functional relationship with the accumulated etching time t and the cyclic order N of each etching operation, and the chamber pressure is gradually decreased from $P_{max}$ to $P_{min}$ with the increase in the accumulated etching time t and the cyclic order N of each etching operation. The boundary point of the piecewise function is a change point of the cyclic order N of each etching operation, i.e., the ending point of each etching operation.

Specifically, in the process of all of the subsequent etching operations after the predetermined time T, for each etching operation, the chamber pressure varies with the accumulated etching time (or the etching time of the current etching operation) in a linear functional relationship; and, for all of the subsequent etching operations after the predetermined time T, the chamber pressure corresponding to each etching operation is lower than that corresponding to the previous etching operation, and the chamber pressure corresponding to the starting point of each etching operation is lower than that corresponding to the ending point of the previous etching operation. Each etching operation corresponds to a certain domain of the piecewise function, and the expressions for both sides of each boundary point of the piecewise function represented by the sequence diagram shown in FIG. 2b are different, i.e., the linear functional relationship corresponding to each etching operation is different, and it is however, not limited thereto in practical applications. In this embodiment, the accumulated etching time includes the so-called predetermined time T.

Figure 2C:
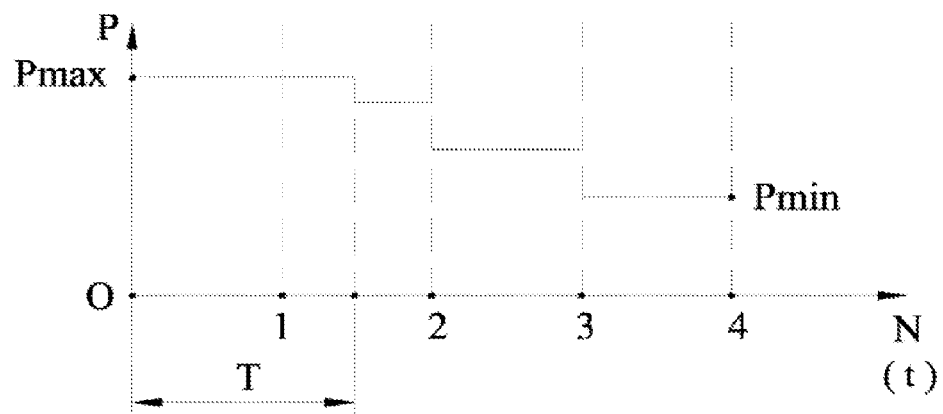
FIG. 2c is a sequence diagram of a third preset rule used for lowering a chamber pressure employed in a substrate etching method according to an embodiment of the invention.

Referring to FIG. 2c, a sequence diagram of a third preset rule used for lowering the chamber pressure employed in a substrate etching method according to an embodiment of the invention is illustrated. The third preset rule is similar to the second preset rule, i.e., in the process of all of the subsequent etching operations after a predetermined time T, the chamber pressure is decreased from a preset highest pressure $P_{max}$ to a preset lowest pressure $P_{min}$ in accordance with a piecewise functional relationship; the difference therebetween only lies in that the sections of the piecewise function corresponding to the respective etching operations after the predetermined time T are represented in a form of constant function, i.e., in each etching. operation, the chamber pressure does not vary with the increase in the accumulated etching time. In this embodiment, the accumulated etching time includes the so-called predetermined time T.

Figure 2D:
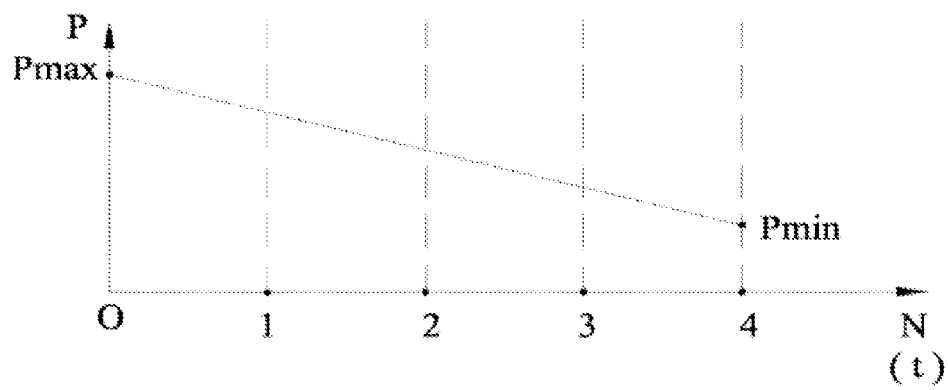
FIG. 2d is a sequence diagram of a fourth preset rule used for lowering a chamber pressure employed in a substrate etching method according to an embodiment of the invention.
Figure 2E:
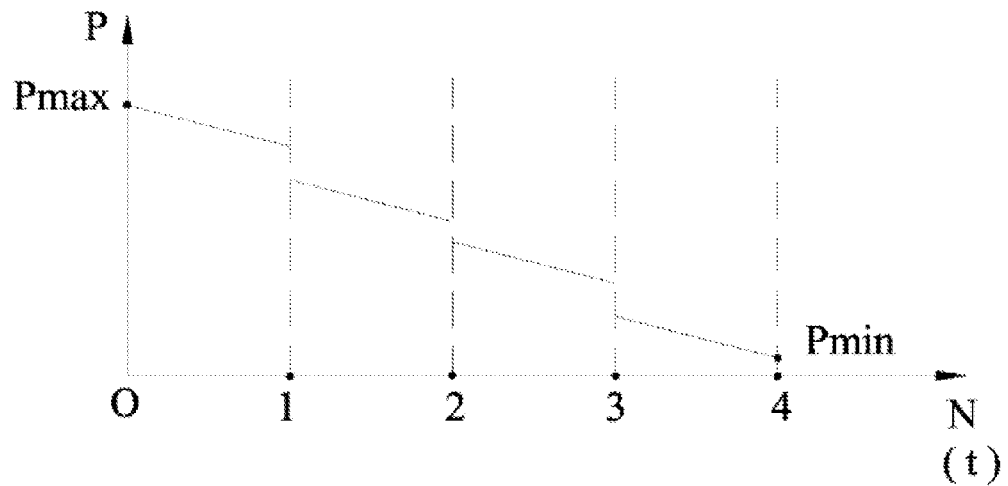
FIG. 2e is a sequence diagram of a fifth preset rule used for lowering a chamber pressure employed in a substrate etching method according to an embodiment of the invention.
Figure 2F:
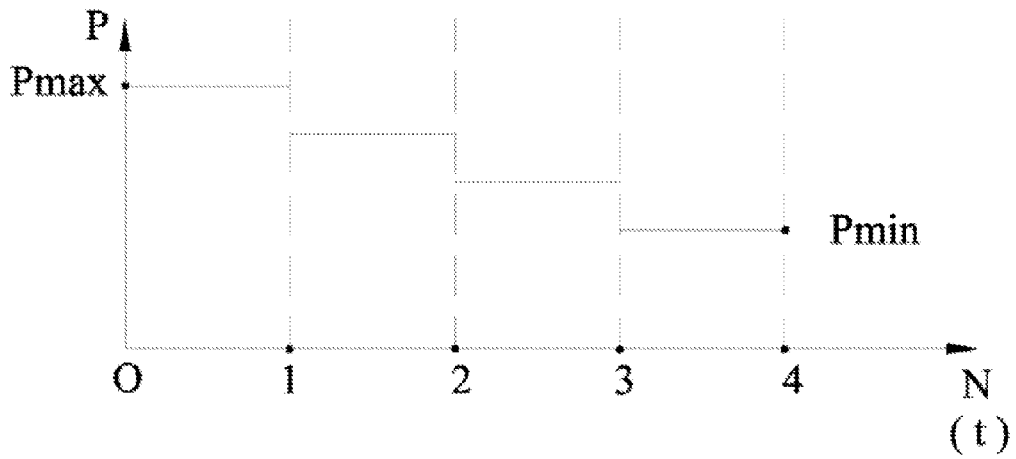
FIG. 2f is a sequence diagram of a sixth preset rule used for lowering a chamber pressure employed in a substrate etching method according to an embodiment the invention.

Referring to FIGS. 2d to 2f, sequence diagrams of fourth, fifth and sixth preset rules used for lowering the chamber pressure employed in substrate etching methods according to various embodiments of the invention are illustrated, respectively. The sequence diagrams shown in FIGS. 2d to 2f are similar to those of FIGS. 2a to 2c, respectively, and the difference therebetween lies in that there is no predetermined time T in the fourth to sixth preset rules. That is to say, as for each of the fourth to six preset rules, the chamber pressure is decreased from a preset highest pressure $P_{max}$ to a preset lowest pressure $P_{min}$ in accordance with a corresponding linear or piecewise functional relationship immediately after the start of the first etching operation.

It should be noted that, although the piecewise function is represented as a linear function or a constant function in the process of different etching operation, and it is, however, not limited thereto in practical applications. For example, it may be represented as any other functional relationship such as exponential function or polynomial function, as long as in the whole process of the etching operations, the chamber pressure can be decreased with the increase in the etching time.

Next, values of the respective parameters in the substrate etching method according to various embodiments of the present invention will be described in detail.

In practical applications, the preset highest pressure may be in the range of 20 mT to 200 mT, the preset lowest pressure may be in the range of 1 mT to 40 mT, the excitation power may be in the range of 50 W to 3000 W, the bias power may be in the range of 0 W to 100 W, the flow of the etching gas may be in the range of 50 sccm to 1000 sccm, and the time for completing all cycles of the etching operation (i.e., the accumulated etching time t) may be in the range of 0.1 s to 1.00 s. Further, if the preset rule used for lowering the chamber pressure employed in the substrate etching method is the first, the second or the third rule, the predetermined time T is then set to be in the range of 0.5 s to 20 s, and in this case, the time for completing all cycles of the etching operation must be longer than the predetermined time T, and may be set to be, for example, 0.5 s to 99.5 s.

Preferably, the preset highest pressure may be in the range of 40 mT to 120 mT, the preset lowest pressure may be in the range of 1 mT to 40 mT, the excitation power may be in the range of 500 W to 2000 W, the bias power may be in the range of 10 W to 40 W, the flow of the etching gas may be in the range of 200 sccm to 700 sccm, and the time for completing all cycles of the etching operation may be in the range of 0.1 s to 100 s. Further, if the preset rule used for lowering the chamber pressure employed in the substrate etching method is the first, the second or the third rule, the predetermined time T may be set to be in the range of 1 s to 10 s, and the time for completing all cycles of the etching operation must be longer than the predetermined time T, and may be set to be 1 s to 99 s.

According to the substrate etching method according to various embodiments of the invention, in the process of completing all cycles of the etching operation, the chamber pressure is decreased from a preset highest pressure to a preset lowest pressure according to a preset rule, instead of keeping the chamber pressure at a relatively high pressure throughout the process of the etching operation as in the conventional art. Therefore, according to the substrate etching method according to various embodiments of the invention, the generated reaction products after etching can be discharged from a silicon groove due to the decrease in the chamber pressure, so that the problem of damaging the side wall of the silicon groove can be avoided, thereby making the profile of the side wall of the silicon groove smooth and improving the process quality.

To verify whether or not the substrate etching method according to various embodiments of the invention makes the profile of the side wall of the silicon groove more smooth, etching tests on substrates are performed by adapting the substrate etching method according to an embodiment of the invention and the substrate etching method in the conventional art, respectively, in this comparative test, the process conditions adapted in both methods are substantially the same except for the chamber pressure.

Referring to FIGS. 3a to 3d, FIGS. 3a and 3b illustrate scanning electron micrographs of a profile of a side wall of a silicon groove obtained by adapting the existing substrate etching method, while FIGS, 3c and 3d illustrate scanning electron micrographs of a profile of a side wall of a silicon groove Obtained by adapting the substrate etching method provided by an embodiment of the present invention. Comparing FIGS. 3a and 3b with FIGS. 3c and 3d, it can be seen that as the chamber pressure is kept at a relatively high level throughout the process of performing the etching operation in the conventional art, the generated reaction products after etching can hardly be discharged from the silicon groove, so that the reaction products accumulated within the silicon groove damage a side wall of the silicon groove, the side wall of the silicon groove thus has a rough profile, which in turn causes the result of the etching process not ideal. In contrast, according to the substrate etching method provided by embodiments of the present invention, in the process of completing all cycles of the etching operation, the chamber pressure is decreased from a preset highest pressure to a preset lowest pressure according to a preset rule, and in such a way, the generated reaction products after etching can be discharged from a silicon groove due to the decrease in the chamber pressure, so that the problem of damaging the side wall of the silicon groove can be avoided, thereby making the profile of the side wall of the silicon groove smooth and improving the process quality.

Terms used herein are provided to explain embodiments, not limiting the invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Embodiments of the invention may suitably comprise, consist or consist essentially of the elements disclosed and may be practiced in the absence of an element not disclosed, According to at least one embodiment, it can be recognized by those skilled in the art that certain steps can be combined into a single step.

The terms and words used in the specification and claims should not be interpreted as being limited to typical meanings or dictionary definitions, but should be interpreted as having meanings and concepts relevant to the technical scope of the invention based on the rule according to which an inventor can appropriately define the concept of the term to describe the best method he or she knows for carrying out the invention.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The singular forms "a,", "an" and "the" include plural referents, unless the context clearly dictates otherwise.

As used herein and in the appended claims, the words "comprise," "has," and "include" and all grammatical variations thereof are each intended to have an open, non-limiting meaning that does not exclude additional elements or steps.

As used herein, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, haying the other element intervening therebetween.

As used herein, the terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "according to an embodiment" herein do not necessarily all refer to the same embodiment.

Although the invention has been described in detail, it should be understood that various changes, substitutions, and alterations can be made hereupon without departing from the principle and scope of the invention. Accordingly, the scope of the invention should be determined by the following claims and their appropriate legal equivalents.

What is claimed is:

1. A substrate etching method, comprising:
a deposition operation for depositing a polymer on a side wall of a silicon groove and an etching operation for etching the side wall of the silicon groove, the deposition operation and the etching operation being alternately repeated at least twice,
wherein, in a process of completing all cycles of the etching operation, a chamber pressure of a reaction chamber is decreased from a preset highest pressure to a preset lowest pressure according to a preset rule.

2. The substrate etching method according to claim 1, wherein the preset rule comprises:
keeping, within a predetermined time elapsed from a start of a first etching operation, the chamber pressure at the preset highest pressure when performing the etching operation; and
decreasing, after the predetermined time elapsed from the start of the first etching operation, the chamber pressure from the preset highest pressure to the preset lowest pressure in accordance with a functional relationship in the process of subsequent etching operations.

3. The substrate etching method according to claim 2, wherein after the predetermined time elapsed from the start of the first etching operation, the chamber pressure is kept unchanged in the process of each etching operation; and the chamber pressure corresponding to each etching operation is lower than the chamber pressure corresponding to the previous etching operation.

4. The substrate etching method according to claim 3, Wherein the functional relationship comprises one of a linear functional relationship, a piecewise functional relationship, an exponential functional relationship, or polynomial functional relationship.

5. The substrate etching method according to claim 2, wherein after the predetermined time lapsed from the start of the first etching operation, the chamber pressure is gradually decreased in accordance with the functional relationship in the process of each etching operation; and the chamber pressure corresponding to each etching operation is lower than the chamber pressure corresponding to the previous etching operation.

6. The substrate etching method according to claim 5, wherein the functional relationship comprises one of a linear functional relationship, a piecewise functional relationship, an exponential functional relationship, or a polynomial functional relationship.

7. The substrate etching method according to claim 2, wherein the predetermined time is in the range of 0.5 s to 20 s.

8. The substrate etching method according to claim 7, wherein the predetermined time is in the range of 1 s to 10 s.

9. The substrate etching method according to claim 8, wherein the functional relationship comprises one of a linear functional relationship, a piecewise functional relationship, an exponential functional relationship, or a polynomial functional relationship.

10. The substrate etching method according to claim 7, wherein the functional relationship comprises one of a linear functional relationship, a piecewise functional relationship, an exponential functional relationship, or a polynomial functional relationship.

11. The substrate etching method according to claims 2, wherein, the functional relationship comprises one of a linear functional relationship, a piecewise functional relationship, an exponential functional relationship, or a polynomial functional relationship.

12. The substrate etching method according to claim 11, wherein the preset highest pressure is in the range of 20 mT to 200 mT, the preset lowest pressure is in the range of 1 mT to 40 mT, an excitation power is in the range of 50 W to 3000 W, a bias power is in the range of 0 W to 100 W, and flow of an etching gas is in the range of 50 sccm to 1000 sccm.

13. The substrate etching method according to claim 1, wherein the preset rule comprises:
gradually decreasing the chamber pressure in accordance with a preset functional relationship in the process of completing all cycles of the etching operation.

14. The substrate etching method according to claim 13, wherein the functional relationship comprises one of a linear functional relationship, a piecewise functional relationship, an exponential functional relationship, or a polynomial functional relationship.

15. The substrate etching method according to claim 1, wherein time for completing all cycles of the etching operation is 0.1 s to 100 s.

* * * * *